(12) United States Patent
Schneider et al.

(10) Patent No.: US 8,914,256 B1
(45) Date of Patent: Dec. 16, 2014

(54) ANALYTICAL SPACE MODEL FOR INTERFACING WITH ENERGY ANALYSIS, FACILITIES MANAGEMENT OR OTHER ANALYSIS APPLICATIONS

(75) Inventors: Matthias Schneider, Oberkirch (DE); John A. Crosby, Leesport, PA (US)

(73) Assignee: Bentley Systems, Incorporated, Exton, PA (US)

( * ) Notice: Subject to any disclaimer, the term of this patent is extended or adjusted under 35 U.S.C. 154(b) by 1036 days.

(21) Appl. No.: 12/357,220

(22) Filed: Jan. 21, 2009

(51) Int. Cl.
*G06F 17/50* (2006.01)
*G06T 11/60* (2006.01)

(52) U.S. Cl.
CPC ............ *G06F 17/5004* (2013.01); *G06T 11/60* (2013.01)
USPC ............................................................ 703/1

(58) Field of Classification Search
CPC ......... G06F 17/50; G06T 17/00; G06T 17/20; G06T 17/205; G06T 17/5004; G06T 11/60
USPC ....................................................... 703/1, 7
See application file for complete search history.

(56) References Cited

U.S. PATENT DOCUMENTS

| | | | |
|---|---|---|---|
| 5,572,637 A | 11/1996 | Brown et al. | |
| 5,850,535 A | 12/1998 | Maystrovsky et al. | |
| 6,341,291 B1 | 1/2002 | Bentley et al. | |
| 6,445,974 B1 * | 9/2002 | Malaugh et al. | 700/182 |
| 6,671,701 B1 | 12/2003 | Chouinard | |
| 6,912,707 B1 | 6/2005 | Fontes, Jr. | |
| 7,130,775 B2 * | 10/2006 | Takagaki et al. | 703/1 |
| 7,194,489 B2 | 3/2007 | Bentley et al. | |
| 2002/0130861 A1 * | 9/2002 | Ujiie et al. | 345/420 |
| 2004/0111243 A1 * | 6/2004 | Okitaka | 703/2 |

OTHER PUBLICATIONS

About bgXML, http://www.gbxml.org/aboutgbxml.php, retreived Jun. 4, 2012, 2 pages.*
Modeling and Meshing Guide, ANSYS, Sep. 1998, Chapter 6, 31 pages.*
"Bentley Structural" Manual, Bentley Systems, Incorporated, Oct. 11, 2005, pp. 1-487.
"Bentley Structural V8 XM Edition" Manual, Bentley Systems, Incorporated, Jul. 7, 2007, pp. 1-198.
"Revit Structure 3—ETABS® Data Exchange," Oct. 7, 2006, pp. 1-11.
"Graphisoft. Archicad 12: A Virtual Building Solution," Graphisoft R&D zrt., Jun. 18, 2008, pp. 1-2.
"Revit Structure Interoperability with AutoCAD," Autodesk, Inc., Feb. 23, 2007, pp. 1-19.
"Interoperability Between Revit Structure and AutoCAD Architecture," Autodesk, Inc., Feb. 23, 2007, pp. 1-13.
Phair, Matthew, "Software Links Physical and Analytical Models," Building Design and Construction, Sep. 1, 2005, pp. 1.
Jaroli, Jozsef, "Using Partial Structure Display for Structural Connection," Jul. 1, 2008, pp. 1-5.

* cited by examiner

*Primary Examiner* — Kamini S Shah
*Assistant Examiner* — Luke Osborne
(74) *Attorney, Agent, or Firm* — Cesari and McKenna, LLP

(57) ABSTRACT

In one embodiment, a technique is provided for exchanging a design of a structure between a modeling application and an analysis application. The model of the structure is scanned in the modeling application, to identify model elements and their interrelationships. Using the identified model elements and their interrelationships, an analytical interface model is generated within the modeling application that provides an abstracted representation of the structure. Such analytical interface model is viewable and modifiable within the user interface of the modeling application. Information regarding the analytical interface model is transferred to the analysis application. This information is used by the analysis application to create a separate analytical model maintained and used by the analysis application.

20 Claims, 11 Drawing Sheets

ANALYTICAL SPACE MODEL FOR INTERFACING WITH ENERGY ANALYSIS, FACILITIES MANAGEMENT OR OTHER ANALYSIS APPLICATIONS

BACKGROUND

1. Technical Field

The present disclosure relates generally to computer-aided engineering design and more specifically to techniques for creating an analytical interface model for exchanging a design of a structure with an analysis application.

2. Background Information

To better manage the complexities of modern designs, design professionals often turn to computer-aided design. In computer-aided design, a design professional creates a model in a modeling application that embodies a project. The model is typically refined and analyzed, in part, using analytical tools, which may be offered in an analysis application, e.g., an external (i.e. separate) analysis application. A model may be used to generate documentation (such as elevations, perspectives, and plans) and reports (such as quantity reports, cost reports, schedules, and specifications), useful in defining and executing the project.

One particular use of computer-aided design is in the architectural design of structures, i.e., buildings and other constructed assets. An architectural design professional tasked with the design of a building or other constructed asset typically produces an architectural model using an architectural modeling application. For example, the architectural design professional may turn to an application such as the Bentley® Architecture building information modeling (BIM) application, available from Bentley Systems Inc., the Bentley® speedikon architectural BIM application, also available from Bentley Systems Inc., the Revit® Architecture BIM application, available from Autodesk Inc., the ArchiCAD® application available from Graphisoft R&D Zrt., or another similar software package. An architectural modeling application typically provides the design professional with an extended toolset for creating an architectural model from elements. Using a computer aided design (CAD)-like interface, the design professional may place, arrange, and configure elements to define the architectural model. Such an architectural model typically has complex and detailed geometry, to provide a complete and life-like representation of a structure.

Sometimes it is desirable to perform different types of analysis on a structure embodied in an architectural model. For example, it may be desirable to perform an energy analysis using dynamic simulation. Such an energy analysis may include various types of analysis, such as heat loss analysis, radiator sizing, heat gain analysis, shadow analysis, heating and air conditioning energy analysis, overheating analysis, mixed mode ventilation analysis, Computational Fluid Dynamics (CFD) studies, and the like. A professional, for example, a mechanical/electrical/plumbing (MEP) professional, may turn to an energy analysis application external from the architectural modeling application, to perform such analysis. For instance, a professional may turn to the Bentley® HevaComp Design Simulation application available from Bentley Systems Inc., the Bentley® Tas Building Energy Modeling and Simulation application available from Bentley Systems Inc., the Tsinghua University Designer Simulation Toolkit (DeST) available from Tsinghua University, or another similar software package.

Further, it sometimes is desirable to manage documents, space and assets associated with a building embodied in an architectural model. In such case, a professional, for example, a logistics professional, may turn to a facilities management application external from the architectural modeling application. For example, a professional may turn to the Bentley® Facilities Planner application available from Bentley Systems Inc., or another similar software package that provides this type of functionality.

Typically, when an external analysis application, such as an energy analysis application, facilities management application, or the like, is utilized, it relies upon a description of a structure exported from an architectural modeling application, or other application. Accordingly, an export routine is generally implemented in such applications to generate such description. The description may take any of a variety of forms. For example, the description may be a Green Building Extensible Markup Language (GBXML) file. GBXML was developed as an industry standard for the transfer of building information among applications, and its specification is publicly available from the Building Performance & Analysis Working Group. Upon receiving the description, for example, the GBXML file, the analysis application may proceed to generate its own analytical model that includes abstracted (e.g., simplified) geometry, excludes certain non-essential elements, and that represents certain structures in a manner suited for the analysis to be performed by the external analysis application. The analysis application may then proceed to use its analytical model to perform analysis.

Generally, the export routine that generates the description, e.g., the GBXML file, is a "black box" function, such that a user may not view the details of the conversion of the architectural model into the description, nor view a visual representation of the description while still within the architectural modeling application. This may present a problem when attempting to investigate any discrepancies, for example, geometric discrepancies, that may be introduced into the analytical model in the external analysis application. A user is forced to attempt to compare the original architectural model in the architectural modeling application, with its complex and detailed geometry and included non-essential elements, with the analytical model in the external analysis application, with its abstracted geometry and without non-essential elements. This may make the identification of discrepancies a laborious and frustrating task.

Further, many external analysis applications require extended processing time, for example, several hours or more of processing time, to perform calculations necessary for different types of analysis. The presence of unaddressed discrepancies, or other errors, in the analytical model, may cause errors in the calculations, which may require analysis to be rerun. As is apparent, this may significantly delay workflow.

Accordingly, there is a need for improved techniques for exchanging a description of a structure between an architectural modeling application and an analysis application.

SUMMARY

In one embodiment, the shortcomings of the prior art are addressed by novel techniques for constructing an analytical interface model inside of an architectural modeling application. The constructed analytical interface model may be used in exchanging a design between the architectural modeling application and an analysis application, e.g., an external analysis application, which uses its own analytical model. The analytical interface model is preferably viewable and modifiable from within the architectural modeling application. In one implementation, the analytical interface model is an Analytical Space Model (ASM) that represents a structure in terms of spaces bounded by surfaces, according to a particular geometry.

More specifically, the architectural modeling application may create and maintain an architectural model embodying a design of a structure, for example, an architectural building model embodying the design of a building. A scanner module, of the architectural modeling application, may scan the architectural model to identify model elements and their interrelationships. The identified model elements and interrelationships may be passed to a geometry processor module, of the architectural modeling application. The geometry processor module may use this information to generate an analytical interface model, for example, an ASM, describing the structure in terms of spaces bounded by surfaces. A user may view or modify the analytical interface model from within the architectural modeling application, i.e., using a user interface of the architectural modeling application. Further, the analytical interface model is preferably implemented in the same file format as the architectural model, to aid comparison therebetween, or in another file format that can hold graphical as well as non-graphical information.

Information regarding the spaces and the surfaces of the analytical interface model may be transferred to the analysis application, e.g., the external analysis application. The analysis application may then use this information to create its own, separate analytical model. In one configuration, the transfer is facilitated by a generator module, of the architectural modeling application, that generates a description from the analytical interface model, in a format understandable by the analysis application. The description is imported by the analysis application, where it is used to build the analysis application's analytical model. In an alternative configuration, the analytical interface model may be "open" to the analysis application, such that the analysis application may directly access the analytical interface model, and obtain information directly therefrom to construct its analytical model.

BRIEF DESCRIPTION OF THE DRAWINGS

The description below refers to the accompanying drawings of example implementations, of which.

DETAILED DESCRIPTION

Figure 1:
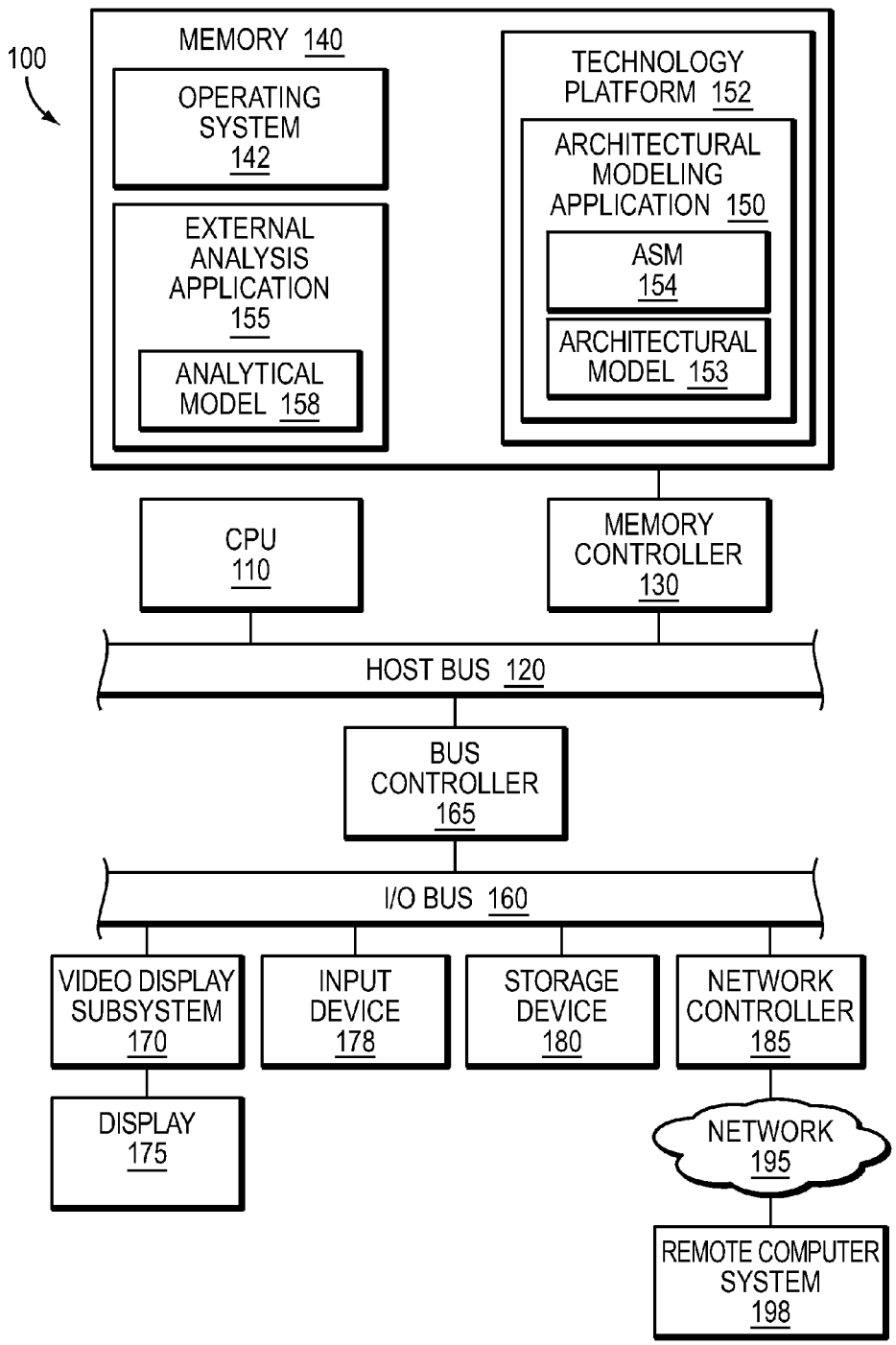
FIG. 1 is a block diagram of an example computer system in which at least some of the presently described techniques may be employed.

FIG. 1 is a block diagram of an example computer system 100 in which at least some of the presently described techniques may be employed. The computer system 100 includes at least one central processing unit (CPU) 110 coupled to a host bus 120. The CPU 110 may be any of a variety of commercially available processors, such as an Intel x86 processor, an IBM PowerPC processor, a SPARC processor, or another type of processor. A memory 140, such as a Random Access Memory (RAM), is coupled to the host bus 120 via a memory controller 130. The memory 140 is adapted to store at least a portion of an operating system 142 while the computer system 100 is operating. In addition, the memory 140 may store portions of application software, including portions of an architectural modeling application 150, and in some cases, an external (i.e., separate) analysis application 155, for example, an energy analysis application, a facilities management application, or another type of separate application, as discussed in more detail below.

The host bus 120 of the computer system 100 is coupled to an input/output (I/O) bus 160, such as a Peripheral Component Interconnect (PCI) bus, through a bus controller 165. A video display subsystem 170, coupled to a display 175, may be connected to the I/O bus 160. The display 175 may display a user interface of the architectural modeling application 150, and, in some cases, a user interface of the external analysis application 155. Similarly, one or more input devices 178, such as, a keyboard, a mouse, or a touch pad, may allow a user to interface with the applications 150, 155.

A storage device 180, such as hard disk drive, a compact disk (CD) drive, Digital Video Disc (DVD) drive, a Flash memory, or other type of device, may be coupled to the I/O bus 160 and persistently store data, including computer-executable instructions. Such persistently stored data may be loaded to the volatile memory 140 when needed. For example, computer-executable instructions related to the operating system 142, the architectural modeling application 150, and, in some cases, the external analysis application 155 may be stored in the storage device 180 until they are needed.

The I/O bus 160 may further be coupled to a network controller 190 that interfaces with a computer network 195. The computer network 195 may allow communication between the computer system 100 and other computer systems, for example, a remote computer system 198, using any of a number of well known network protocols. Such network communication may allow certain remote, distributed and/or parallel computing configurations.

In more detail, the architectural modeling application 150 may be an architectural building information modeling (BIM) application operating within a common technology platform 152. Such a common technology platform 152 may provide base functionality relating to object management, geometric modeling, drafting, information and standards management, visualization, drawing and report extraction, as well as other tasks. In the preferred embodiment, the architectural modeling application 150 is the Bentley® Architecture BIM application and the technology platform 152 is the MicroStation Triforma® technology platform, also available from Bentley Systems Inc. However, the architectural modeling application 150 may alternatively be another application, such as the Bentley® speedikon architectural BIM application, the Revit® Architecture BIM application, the ArchiCAD® application, or another software application that provides modeling functionality. Similarly, the technology platform 152 may be a different technology platform, or may not be employed at all, depending on the particular implementation.

The architectural modeling application 150 may create and maintain an architectural model 153 embodying a design of a structure, for example, an architectural building model embodying a design of a building. The architectural model may be stored in an architectural model file or in multiple architectural model files. In one embodiment, the architectural model file is a design (DGN) file, formatted according to the MicroStation® V8 DGN standard.

The external analysis application 155 may be an energy analysis application, such as the Bentley® HevaComp Design Simulation application, the Bentley® Tas Building Energy Modeling and Simulation application, or the Tsinghua University Designer Simulation Toolkit (DeST); may be a facilities management application, such as the Bentley® Facilities Planner application; or may be another type of separate application. The external analysis application 155 may maintain its own, separate analytical model 158. For example, it may maintain an analytical model embodying the design of a building, in an analytical file, or in multiple files.

While FIG. 1 depicts both the structural modeling application 150 and the external analysis applications 155 as resident in the memory 140, for execution locally on CPU 110, they may instead be resident on differing computer systems. For example, in one alternative configuration, the external analysis application 155 may be resident in the memory of, and executed on, a remote computer system 198. In such a configuration, the exchange of a design with the external analysis application 155 may include transmission of data over the computer network 195. Alternatively, both the architectural modeling application 150 and the external analysis application 155 may be resident in the memory of, and executed on, a number of interconnected computer systems, for example, on a server farm, and users may remotely interact with such applications. In light of the variety of computing arrangements commonly used in the art, it should be understood that the techniques described herein are not limited to use on in a single computer system 100, but may also used with a variety of remote, parallel, and/or distributed computing arrangements.

As discussed above, an architectural model 153, such as an architectural building model, may be created and maintained by the architectural modeling application 150. An architectural model typically includes a plurality of model elements that provide a detailed description of elements of a structure. The model elements may be represented as objects according to object oriented programming (OOP) principles. A "campus" object may include a list of buildings. A "building" object in may include floors, walls, panels and space shapes. A "floor" object may define a floor element in terms of a horizontal base level (elevation), an overlap slab thickness, and a default height. A "wall" object may define a vertical wall element in terms of a two-dimensional centerline and a fixed width. A "panel" object may define a floor, a roof or a ceiling element in terms of a three-dimensional base shape and a height. Further, a "space shapes" object may define properties of spaces or rooms, for example, may indicate a name associated with a space or room. One or more "openings" objects may belong to wall objects or panel objects, and may define openings, such as doorways, windows and the like. Collectively, the objects of the architectural model 153 provided a detailed description of model elements and their interrelationships.

Figure 2:
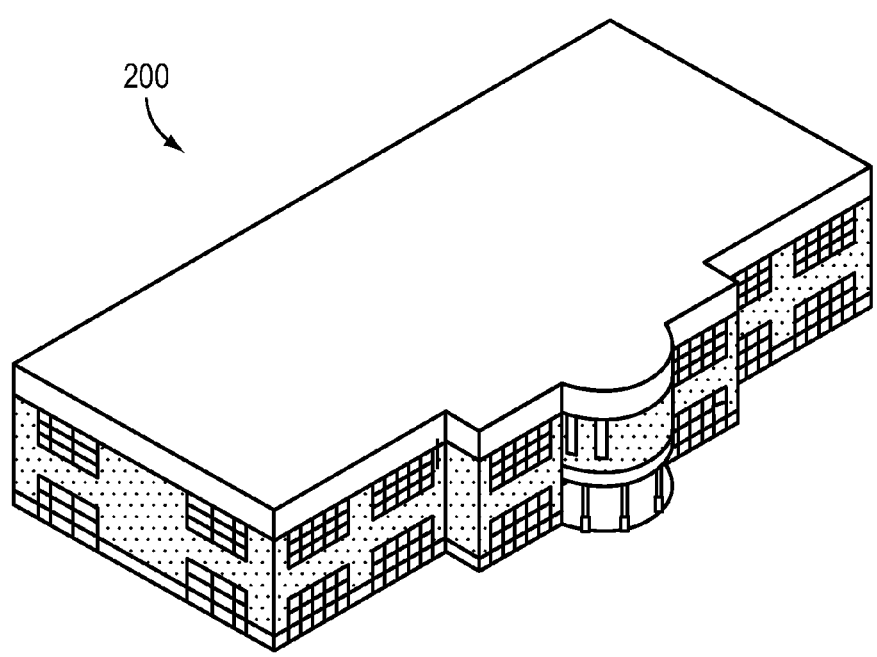
FIG. 2 is a graphical depiction of an example architectural model that may be maintained by an architectural modeling application.

FIG. 2 is a graphical depiction 200 of an example architectural model 153 that may be created and maintained by an architectural modeling application 150. Such graphical depiction 200 may be generated from the above described objects, to provide a visualization of the information maintained in the architectural model 150.

As discussed above, it may be desirable to export a description of a structure from the architectural modeling application 150 to an analysis application, e.g., an external analysis application 155, to perform energy analysis, facilities management, or other types of analysis. However, analysis applications typically utilizes their own, native, analytical models that includes abstracted (e.g., simplified) geometry and exclude certain non-essential elements.

The present disclosure describes novel techniques for constructing an analytical interface model inside of an architectural modeling application 150. Such an analytical interface model may be used in exchanging a design with an analysis application, e.g., an external analysis application 155 that uses an analytical model 158. The analytical interface model, in one embodiment, is an Analytical Space Model (ASM) 154 (see FIG. 1), which represents a design in terms of spaces bounded by surfaces. Elements from the architectural model 153 may be divided into multiple surfaces that each belong to particular spaces. Further, non-essential elements, for example, non-space related information in the architectural model, may be excluded from the ASM 154.

The ASM 154 is preferably viewable and modifiable from within the architectural modeling application 150. That is, the ASM 154 may be accessed from within the user interface of the architectural modeling application 150. By allowing a user to view and modify analytical state from within the architectural modeling application 150, any discrepancies in the analytical representation of the structure may be readily investigated and corrected.

In one implementation, the ASM 154 may have the same file format at the architectural model 153, for example, it may be a DGN file formatted according to the MicroStation® V8 DGN standard. This may ease comparison between the architectural model 153 and the ASM 154. Alternatively, the ASM 154 may have another file format. For example, the ASM 154 may have a drawing (DWG) file format, a drawing exchange format (DXF) file format, an interactive graphics design software (IGDS) file format, or another type of graphical file format.

A description, such as a GBXML file, may be generated from the ASM 154 and exported to the external analysis application. The external analysis application may then build its own analytical model 158, in its own native format, therefrom. Such building may be implemented through an interpretation and mapping process. Alternatively, the ASM 154 may be "open" to the external analysis application 155, such that the external analysis application 155 may directly obtain information regarding spaces, surfaces and geometry directly therefrom as required.

As with the architectural model 153, an ASM 154 may be constructed according to OOP principles. However, the ASM 154 focuses on describing the design in a space-centric manner. A "campus" object of the ASM 154 may include a list of buildings. A "building" object may include a set of spaces and surfaces which form the building. "Spaces" objects define physical space in a building. That is, they describe a volume, for example, bounded by walls and panels from all sides. "Surfaces" objects are abstracted definitions of walls or panels, where elements are reduced to planar shapes (i.e., zero-thickness representations) located at the centerline, or at an external surface, of the wall or panel. As discussed in more detail below, surfaces may be extended, and/or virtual surfaces created, to close space boundaries to provide a "closed shell" geometry, i.e., a geometry where there are no gaps in the surfaces surrounding a space.

Figure 3:
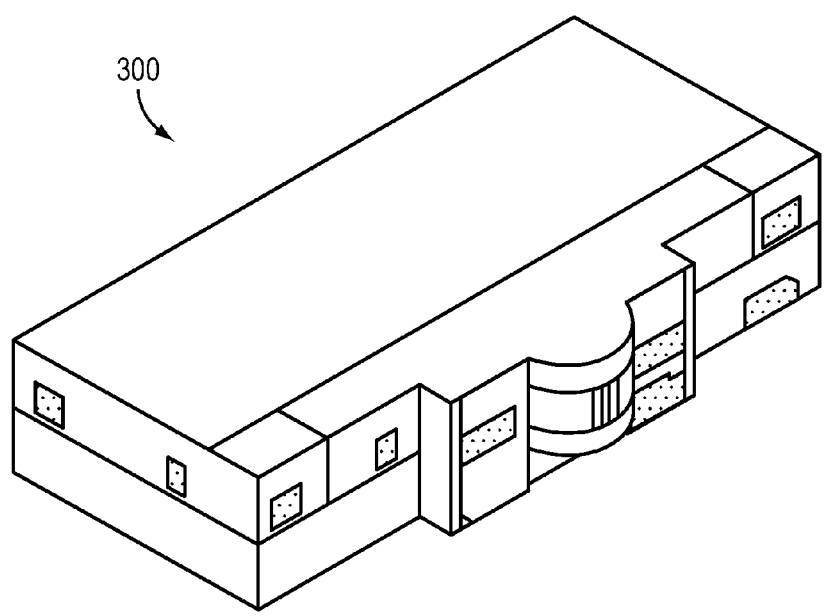
FIG. 3 is a graphical depiction of an example Analytical Space Model (ASM) that may be created from an example architectural model.

FIG. 3 is a graphical depiction 300 of an example ASM 154 that may be created from the example architectural model 153. Such graphical depiction 300 may be generated from the above described objects, and displayed to a user in the user interface of the architectural modeling application 150, for example, via the display 175 of the computer system 100. A user may interact with the ASM 154, for example, using the user interface of the architectural modeling application 150, to cause the ASM 154 to be modified.

Figure 4:
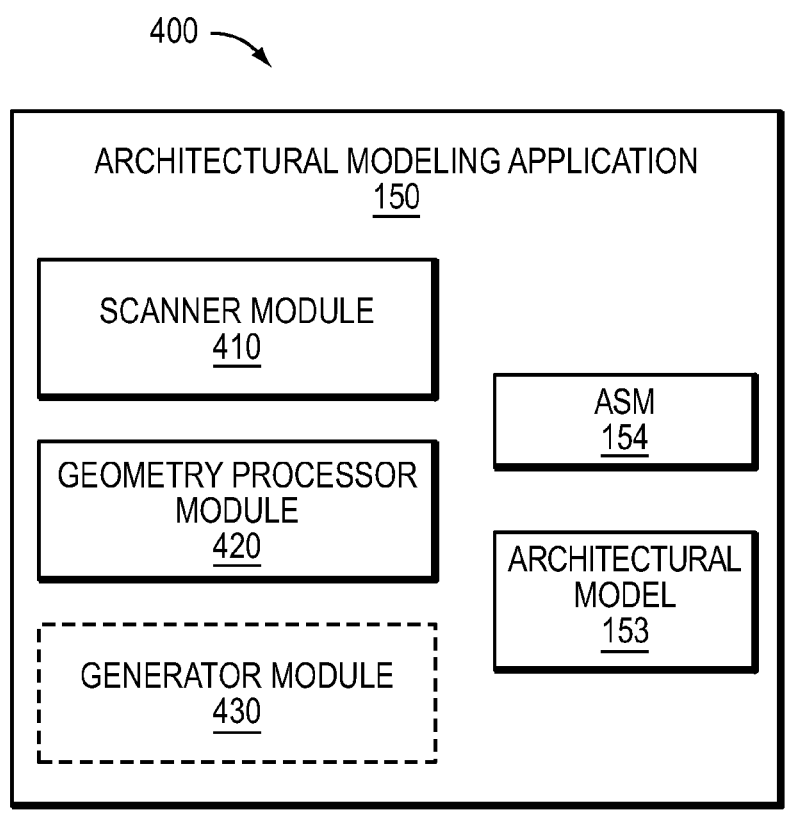
FIG. 4 is an expanded block diagram of the example architectural modeling application of FIG. 1, depicting a plurality of internal modules that may be used to create the ASM and to exchange information in the ASM with an analysis application, e.g., an external analysis application.

FIG. 4 is an expanded block diagram 400 of the example architectural modeling application 150 of FIG. 1, depicting a plurality of internal modules 410-430 that may be used to create the ASM 154, and to exchange information in the ASM 154 with the external analysis application 155. The expanded block diagram 400 omits many conventional modules of the architectural modeling application 150 for clarity. The architectural modeling application 150 may include a scanner module 410 that is configured to read and extract data from the architectural model 153. The scanner module 410 may work in conjunction with a geometry processor module 420. The geometry processor module 420 may, in response to data from the scanner module 310, generate a list of spaces bounded by surfaces, with relationships and attributes. Such a list forms the basis of the ASM 154. An optional generator module 430 may generate a description, in a format understandable by the external analysis application 155, from the ASM 154. Such description may be a GBXML file.

Figure 5:
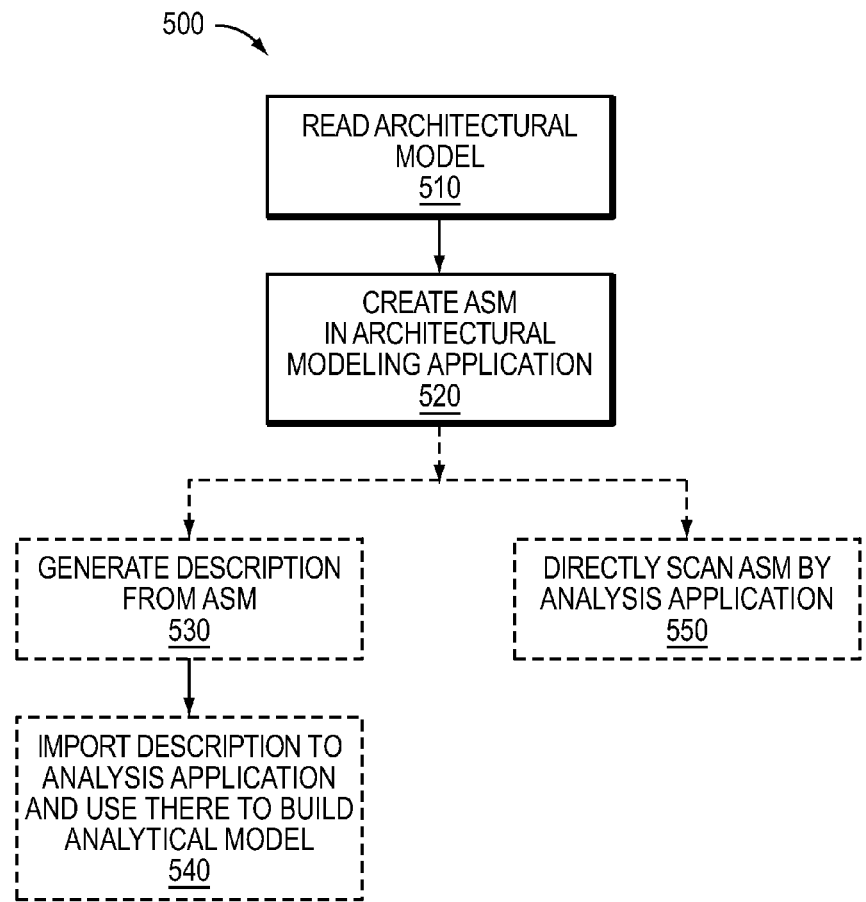
FIG. 5 is a flow diagram showing an example sequence of steps that may be performed by the example modules of FIG. 4.

FIG. 5 is a flow diagram showing an example sequence of steps 500 that may be performed by the example modules 410-430 of FIG. 4. At step 510, elements of the architectural model 153 are read by the scanner module 410, and information supplied to the geometry processor module 420. At step 520, the geometry processor module 420 creates an ASM 154 that describes the design of the structure in terms of spaces bounded by surfaces. The ASM 154 may be stored as one or more files, for example, as a DGN file formatted according to the MicroStation® V8 DGN standard. At optional step 530, a generator module 430 generates a description from the ASM 154, in a format understandable by the external analysis application 155. For instance, the generator module 430 may generate a GBXML file. Thereafter, at optional step 540, the description is imported by the external analysis application 155, where it may be used to build an analytical model 158 used by the external analysis application 155. Such building of the analytical model 155 may use an interpretation and mapping process.

Alternatively, at optional step 550, the external analysis application 155 may directly scan the ASM 154, for example, by accessing its objects. In this manner, the ASM 154 may be directly used to transfer geometry, relationships, and other information to the external analysis application 155, absent "re-interpretation." That is, in such a configuration, there is no need to generate an additional description, for example, a GBXML file.

Figure 6:
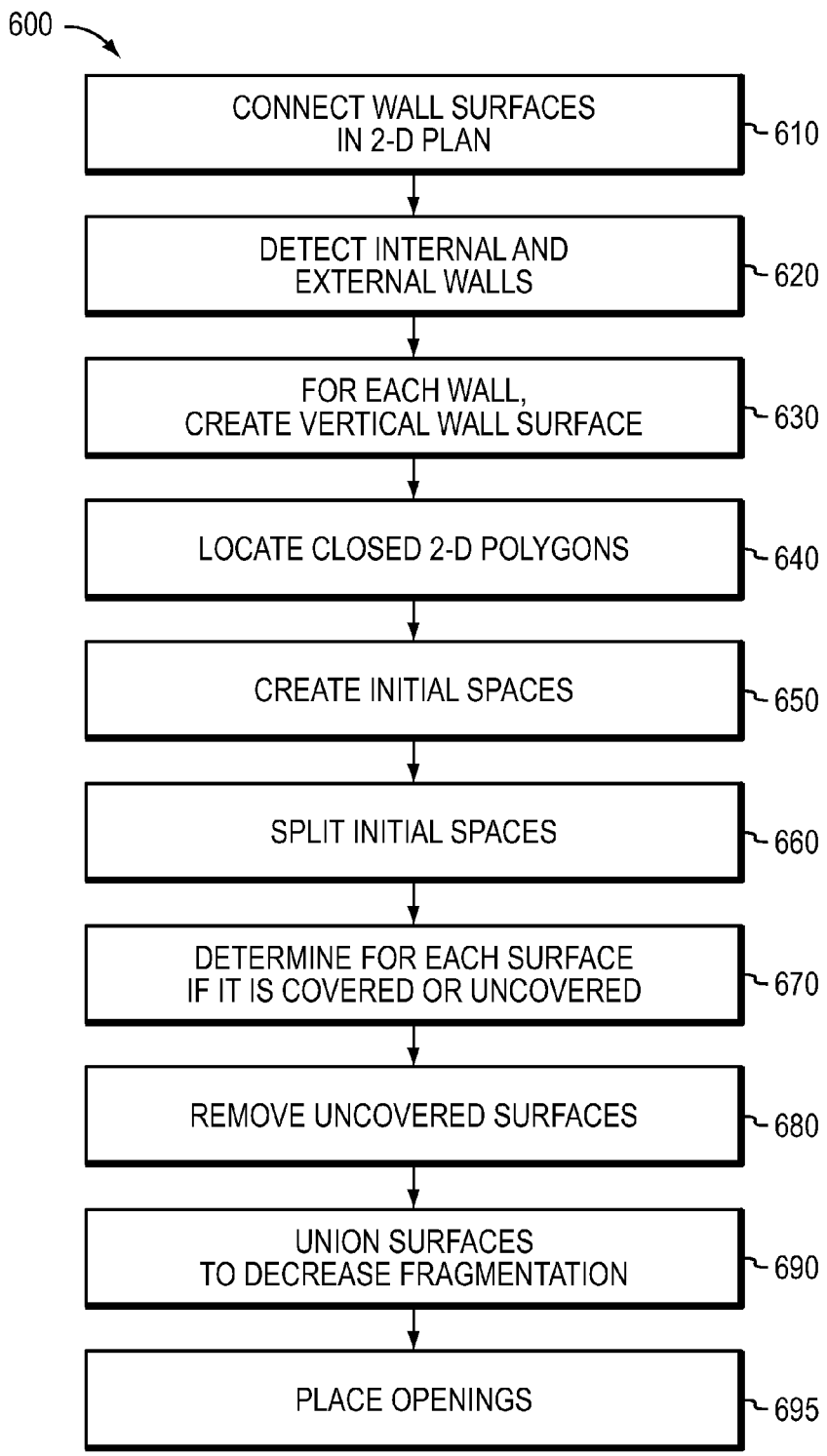
FIG. 6 is an expanded flow diagram showing an example sequence of steps that may be performed to generate a list of spaces bounded by surfaces, with appropriate relationships and attributes, that define an ASM.

FIG. 6 is an expanded flow diagram showing an example sequence of steps 600 that may be performed to generate a list of spaces bounded by surfaces, with appropriate relationships and attributes, to define an ASM 154. Some, or all, of the example sequence of steps 600 may be implemented as part of step 520 discussed above. At step 610, wall surfaces are connected in a two-dimensional plan representation of the design. At step 620, if enabled by a user, internal and external walls are detected, and the position of wall surfaces is determined. For example, internal wall surfaces may be defined along the centerline of walls, while external wall surfaces may be defined along the external face of walls. At step 630, for each wall, a vertical wall surface is created. In some cases, the vertical wall surface may encompass a number of levels of a building. At step 640, the geometry processor module 420 locates any closed two-dimensional polygons from projection of the surfaces onto horizontal planes. From these, at step 650, initial spaces are created. Such spaces may be bounded on the sides by the vertical wall surfaces, determined in step 630, and on the top and bottom by the polygons, from step 640. At step 660, the initial spaces are split by planes associated with overlapped slabs and any panels. At step 670, it is determined for each surface if it is covered by a building element, or if it is uncovered. At step 680, any uncovered surfaces are removed, and adjacent spaces joined or removed as appropriate. At step 690, a union is taken of certain surfaces, to decrease fragmentation of the model. Finally, at step 695, any openings are placed in the surfaces.

One issue that may arise in the creation of spaces bounded by surfaces, according to a procedure such as that discussed in reference to FIG. 6, is that, absent special techniques, gaps may be created between surfaces. As discussed above, in an architectural model 153 a wall is typically defined in terms of a two-dimensional center line and a fixed width, such that it has three-dimensional shape. When walls are abstracted to zero-thickness surfaces, absent special techniques, gaps may result that could prevent spaces from having a "closed shell" geometry.

Figure 7A:
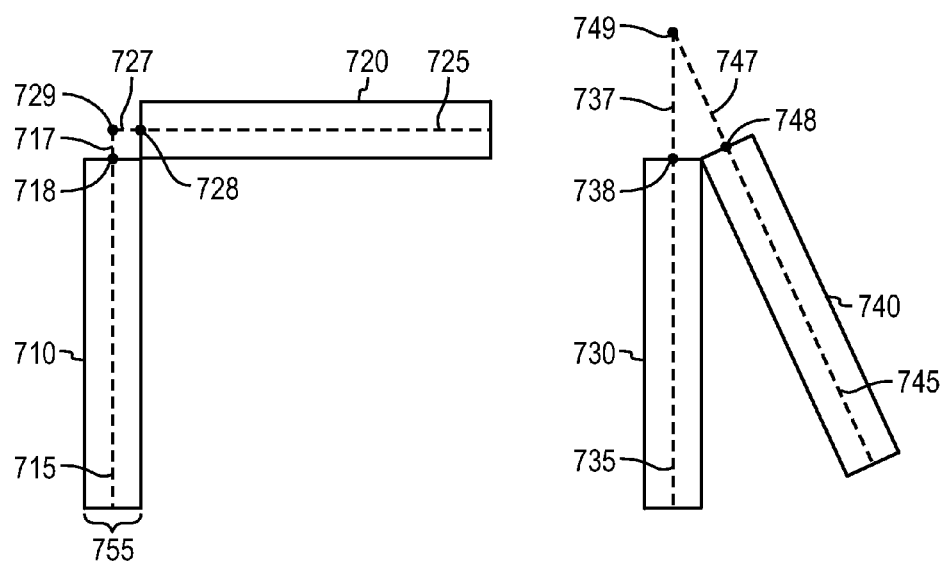
FIG. 7A is an illustration of first and second example walls in an architectural model, each wall having a centerline and a width.

FIG. 7A is an illustration of first 710, 720 and second 730, 740 example walls in an architectural model 153, each wall having a centerline and a width. First example walls 710, 720 have first centerlines 715, 725, and are connected and meet at a right angle. As can be seen, while the first walls intersect, the first centerlines 715, 725 do not, and thus, if a zero-thickness surface were to be defined along the centerlines, a gap would be introduced. Similarly, second example walls 730, 740 have second centerlines 735, 745, and are connected and meet at an acute angle. As can be seen, while the second walls intersect, the second centerlines 735, 740 do not, and thus, again, if a zero-thickness surface were created along the second centerlines, a gap would be introduced.

Figure 8:
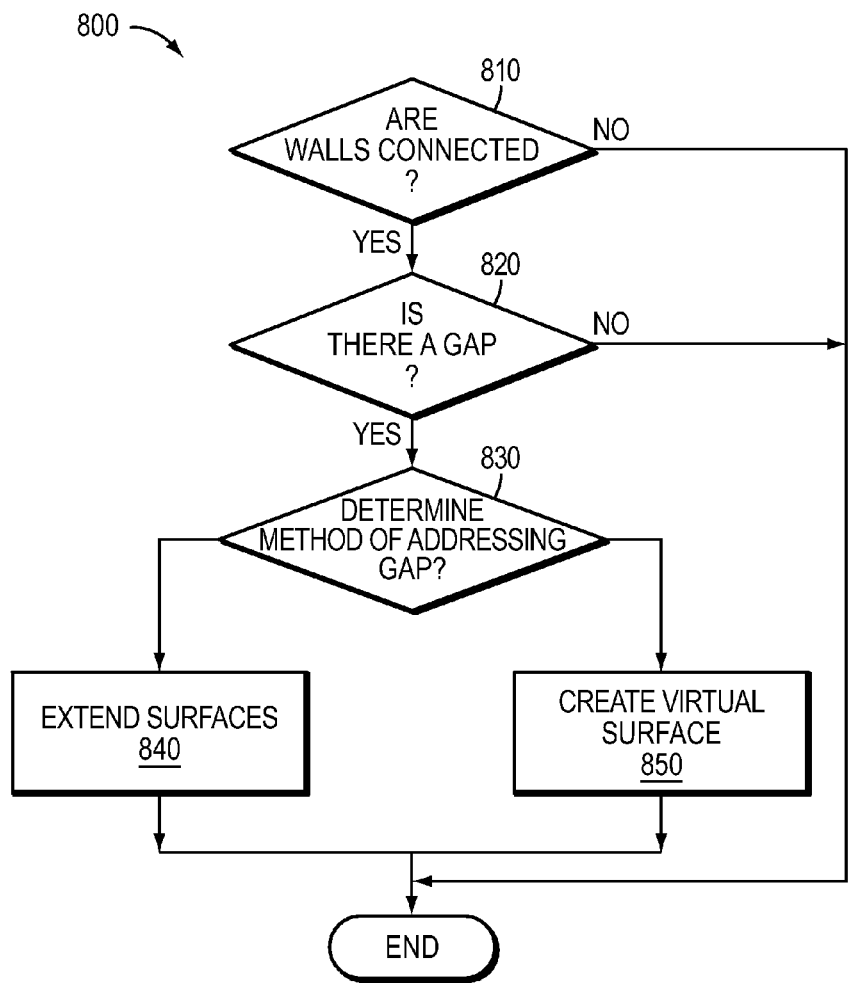
FIG. 8 is a flow diagram showing an example sequence of steps that may be performed to address gaps between wall surfaces.

FIG. 8 is a flow diagram showing an example sequence of steps 800 that may be performed to address gaps between wall surfaces. At step 810, the geometry processor module 420 determines whether or not walls are connected, by looking to a number of factors. For example, the geometry processor module 420 may determine if walls have common elevation and, should line segments be extended along their centerlines having a length no longer than a "gap tolerance" (for example, a user-settable "gap tolerance"), would the their be an intersection. Referring to FIG. 7A, first example line segments 717, 727 may be projected along first centerlines 710, 720, and second example line segments 737, 747 may be projected along second centerlines 730, 740. If there is no intersection of such line segments, it is determined the walls are not connected and the sequence of steps terminates. If there is an intersection, it is determined the walls are connected. Execution then proceeds to step 820, where the geometry processor module 420 determines if the centerlines themselves intersect, or if there is a gap. If the centerlines intersect, the sequence of steps terminates. If not, and there is a gap, the geometry processor module 420 determines a method for addressing the gap at step 830. In one implementation, such determination is made based on a comparison of the distance between the endpoints of the centerlines and their intersection point, and the wall thickness. Referring to FIG. 7A, a distance from first endpoints of centerlines 718, 728 to first intersection point 729 may be measured, and compared to the wall thickness 750. Likewise, a distance from second endpoints of centerlines 738, 748 to second intersection point 749 may be measured, and compared to the wall thickness 755. If the distance from the end points of the centerlines to the intersection point is less than the wall thickness, execution may proceed to step 840, where the surfaces in the ASM 154 are extended to create a "closed shell" geometry. Otherwise, execution may proceed to step 850, where a virtual wall surface joining the two surfaces in the ASM 154 is added to produce a "closed shell" geometry.

Figure 7B:
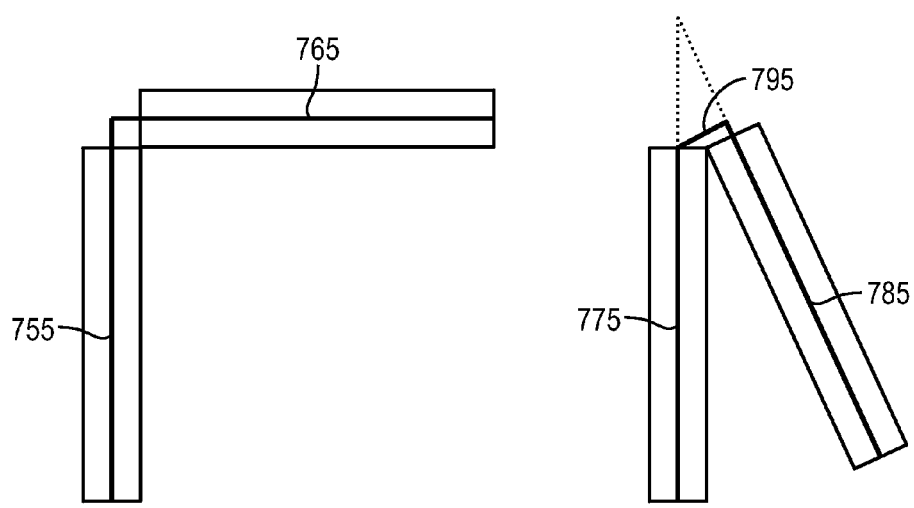
FIG. 7B is an illustration of an example extension of wall surfaces and an example addition of a virtual wall surface to address a gap.

FIG. 7B is an illustration of extension of wall surfaces and addition of a virtual wall surface in the ASM 154 to address a gap. Example surfaces of the ASM 154 are shown overlaid upon the walls of the architectural model 153, for purposes of illustration. Using the techniques of step 840 discussed above, surfaces 755, 765 may be extended to intersect. Similarly, using the techniques of step 850 discussed above, a virtual surface 795 may be added to join surfaces 775 and 785. In both cases, a "closed shell" geometry results.

The above described techniques for addressing gaps between surfaces in the creation of an ASM 154 may also be applied to situations where three or more walls intersect. In such cases, a determination may be made to extend and change the direction of surfaces so they intersect, or to add virtual wall surfaces. Such determination, as discussed below, may be based upon a user's selection.

Figure 9:
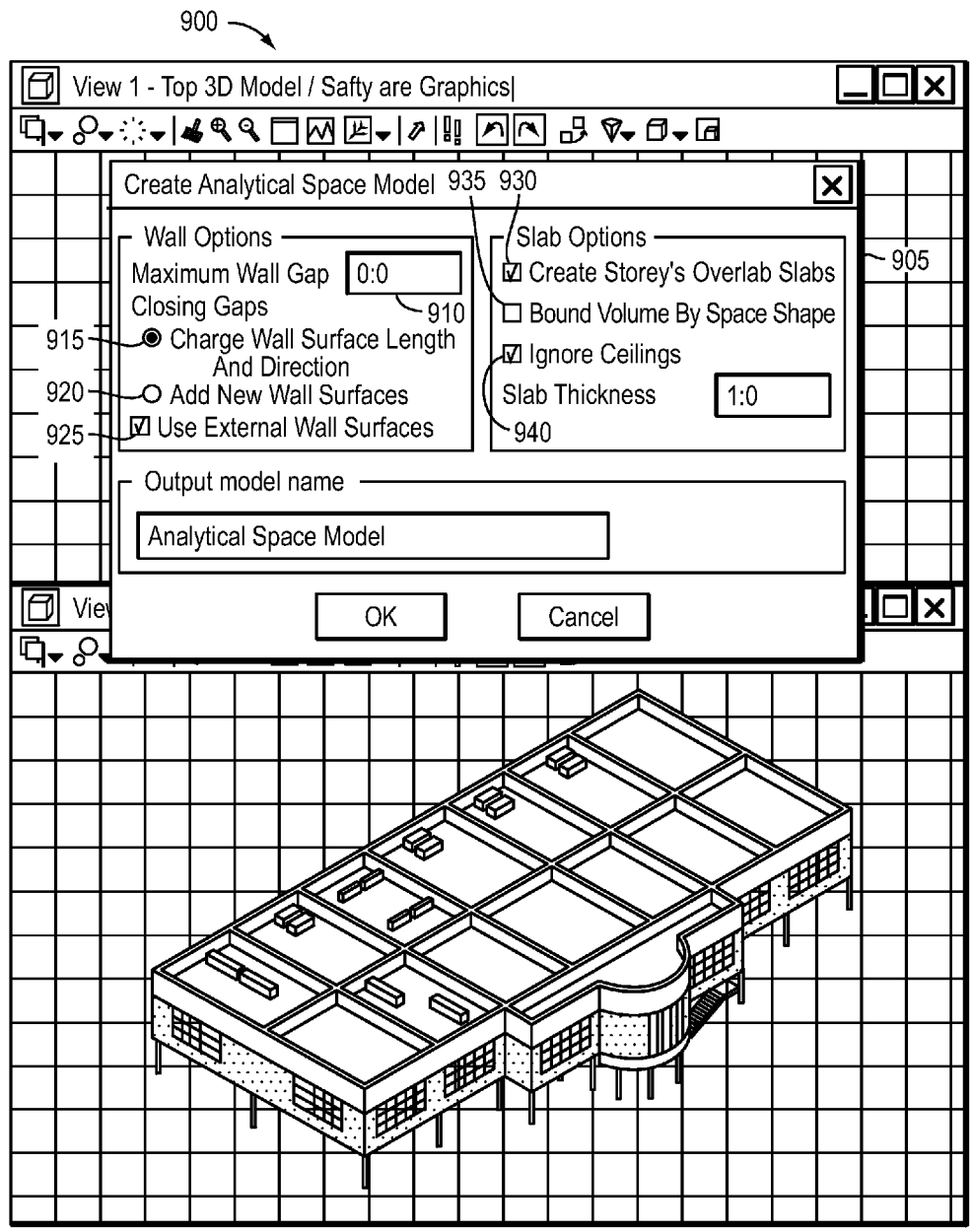
FIG. 9 is an example graphical user interface (GUI) that may be provided in a user interface of an architectural modeling application to allow a user to customize creation of an ASM.

FIG. 9 is an example graphical user interface (GUI) 900 that may be provided in a user interface of the architectural modeling application 150 to allow a user to customize creation of an ASM 154. While the user is viewing a graphical depiction 200 of the architectural model 153 in a portion of the GUI 900, the user may activate a "Create Analytical Space Model" dialog box 905. In a field 910, a user may define a maximum gap between surfaces, to be used in the above described techniques for addressing gaps. Using radio buttons 915, 920, a user may choose whether certain gaps, for example, those created in situations where three or more walls intersect, are to be addressed by extending and changing the direction of wall surfaces, or by the addition of virtual wall surfaces. At a check box 925, a user may select to have the geometry processor module 420 classify wall surfaces as external or internal based on their adjacency characteristics. As discussed above, the classification of a wall surface as external or internal may effect whether a wall surface is defined along the centerline or along the external face of the wall. At a check box 930, a user may opt to have the geometry processor module 420 automatically create slab surfaces to bound the top and bottom of spaces at a floor elevation level, while at another check box 935 the user can elect to have the geometry processor module 420 automatically locate spaces that are not bounded at their top and bottom and close any such spaces to create a "closed shell" geometry.

At check box 940, a user may instruct the geometry processor module 420 to consider ceiling voids in the architectural model 153, or to ignore such voids when defining spaces. Such option may be particularly useful when the external analysis application 155 is an energy analysis application. In energy analysis, ceiling voids may be considered "unconditioned", if they are open to the same thermal characteristics as the occupied space below, or may be considered "conditioned", if they are separate, and have different thermal characteristics than the occupied space below. If ceiling voids are "unconditinned", they may be selected to be ignored in generation of the ASM 154, such that a single space is created for rooms. If ceiling voids are "conditioned", a separate space may be created for them, such that a room is considered as two separate spaces within the ASM 154.

Figure 10:
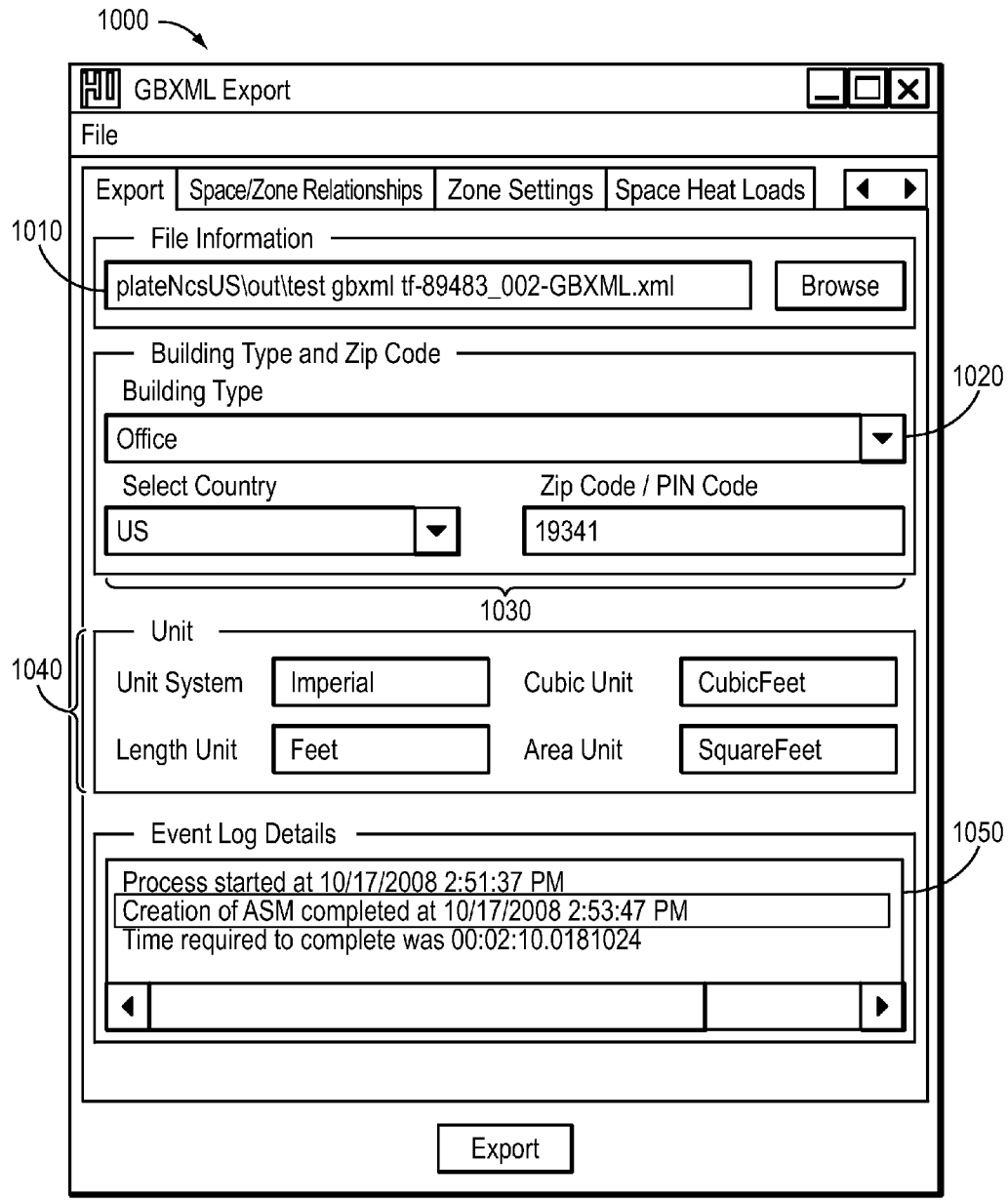
FIG. 10 is an example GUI that may be provided in a user interface of an architectural modeling application to allow a user to customize creation of a description, for example a GBXML file, from the ASM, for export to an analysis application.

FIG. 10 is an example GUI 1000 where a user may customize the creation of a description, for example a GBXML file, from the ASM 154. A file information field 1010 allows a user to define a location where the description is to be stored. A building type option 1020 allows a user to designate a generic type of structure, which may cause certain related standard information, for example, a standard occupancy type, a standard occupancy schedule, or typical design loads, to be appended to the description. Further, country and zip code entry fields 1030 allow an approximate location to be entered, which is appended to the description for possible use by the external analysis application 155. Alternative configurations may include fields for entry of additional information, such as geographical elevation, counters, and the like. Units selection fields 1040 may permit selection of a units system, while an event log field 1050 displays a summary of the tasks performed in, and time expended in, creation of the ASM 154. In some implementations, the event log field 1050 may display an indication of any recognized discrepancies in the ASM 154. For example, the event log field 1050 may inform a user that two surfaces occupy the same location, or that there is an overlap in defined spaces, so the user may address such issues.

While the above description discusses various embodiments of the present disclosure, it should be apparent that a number of modifications and/or additions may be made without departing from the disclosure's intended spirit and scope.

For example, while it is discussed above that an analytical interface model, such as an ASM 154, is used for exporting a design from an architectural modeling application 150 to an analysis application, e.g., an external analysis application 155, it should be remembered that an analytical interface model may also be used in connection with importing a design, for example, an updated design including analysis results, from an analysis application back into an architectural modeling application. Accordingly, it should be understood that the above described techniques are applicable to a variety of types of exchanges of model data, including "round-tripping" of model data.

Further, while it is discussed above that the analytical interface model is used for exchanging a description of a structure between an architectural modeling application 150 and an analysis application, the techniques disclosed herein may also be applicable to exchanges of model data between other types of applications. For example, the teachings may alternatively be used with exchanges of model data between other types of applications, including structural modeling applications, mechanical modeling applications, general-purpose CAD applications, graphics design applications, mathematical analysis applications, and the like.

Further, while it is discussed above that the analysis application may be an external application, it should be understood that the analysis application, alternatively, may be an internal application. That is, both the architectural modeling application and the analysis application may be part of an integrated application suite or package, possibly sharing a common memory space and/or accessing common libraries.

Further, while it is discussed above that an analytical interface model, such as ASM 154, is a general purpose model, which may be used with a variety of types of applications, in some alternative implementations the analytical interface model may be a discipline-specific model, which includes extensive discipline-specific information. For example, the ASM 154 may be an Energy Analysis Model (AEM) specifically adapted for use with energy analysis applications.

Further, while it is discussed above that an analytical interface model may be stored in an analytical file, or in multiple files, separate from one or more architectural model files, in some alternative implementations, the analytical interface model and the architectural model may reside in the same file. In such alternative implementations, elements of the analytical interface model and elements of the architectural model may be separated by use of analytical levels inside the file, or via other techniques. It should be understood, in general, that a plurality of models may reside in a single file and that the techniques describes herein are applicable to such configurations.

Further, it should be understood that the above described techniques may be implemented in software, in hardware, or in a combination thereof. A software implementation may include computer-executable instructions stored in a computer-readable storage medium, for example, a CD, a DVD, a RAM, a Flash memory, or the like. A hardware implementation may include processors, memories, programmable logic circuits, application specific integrated circuits, and/or other types of hardware components. Further, a combined software/hardware implementation may include both computer-executable instructions stored in a computer-readable storage medium, as well as one or more hardware components.

Accordingly, it should be understood that the above descriptions are meant to be taken only by way of example.

What is claimed is:

1. A method for exchanging a design of a structure between a modeling application executing on a computer system having a display, and an analysis application, the method comprising:
   scanning an architectural model of the structure that is used by the modeling application, the architectural model including model elements, wherein at least some of the model elements are walls having a three-dimensional shape with non-zero thickness, the scanning to identify the model elements and their interrelationships;
   using the identified model elements and their interrelationships to generate an analytical interface model within the modeling application, the analytical interface model describing the structure in terms of spaces bounded by zero-thickness surfaces, generation of the analytical interface model to abstract the at least some model elements of the architectural model which have three-dimensional shape with non-zero thickness into zero-thickness surfaces in the analytical interface model;
   automatically adjusting an extent of at least some of the zero-thickness surfaces to differ from an extent of their corresponding model elements of the architectural model by
      determining two or more walls are connected in the architectural model,
      determining a gap will occur between zero-thickness surfaces corresponding to the two or more walls in the analytical interface model, and
      in response to the determining two or more walls are connected and the determining a gap will occur, automatically extending at least one of the zero-thickness surfaces corresponding to the two or more walls to prevent the gap;
   displaying a visual representation of the analytical interface model to a user within a user interface of the modeling application shown on the display of the computer system;
   modifying the analytical interface model within the modeling application absent changing the architectural model; and
   transferring information regarding the spaces and the zero-thickness surfaces of the analytical interface model to the analysis application, the information used by the analysis application to build a separate analytical model used by the analysis application.

2. The method of claim 1, wherein the analysis application is an external application.

3. The method of claim 1, wherein the transferring further comprises:
   generating a description from the analytical interface model in a format understandable by the analysis application; and
   providing the description to the analysis application.

4. The method of claim 3, wherein the description is a Green Building Extensible Markup Language (GBXML) file.

5. The method of claim 1, wherein the transferring further comprises:
   permitting the analysis application to directly access the analytical interface model and to obtain the information regarding the spaces and the zero-thickness surfaces directly therefrom.

6. The method of claim 1, further comprising:
   in response to input from a user in the user interface of the modeling application, modifying the analytical interface model.

7. The method of claim 1, wherein the analytical interface model is a separate file that has a same file format as a file that stores the architectural model.

8. The method of claim 1, wherein the analytical interface model has a file format that is one of a drawing (DWG) file format, a drawing exchange format (DXF) file format or an interactive graphics design software (IGDS) file format.

9. The method of claim 1, wherein the analytical interface model is stored in a same file as the architectural model.

10. The method of claim 1, wherein the structure is a building, the modeling application is an architectural modeling application, and the architectural model is an architectural building model.

11. The method of claim 1, wherein the analysis application is an energy analysis application.

12. A method for exchanging a design of a structure between a modeling application executing on a computer system having a display, and an analysis application, the method comprising:
   scanning an architectural model of the structure that is used by the modeling application, the architectural model including model elements, wherein at least some of the model elements are walls having a three-dimensional shape with non-zero thickness, the scanning to identify the model elements and their interrelationships;
   using the identified model elements and their interrelationships to generate an analytical interface model within the modeling application, the analytical interface model describing the structure in terms of spaces bounded by zero-thickness surfaces, generation of the analytical interface model to abstract the at least some model elements of the architectural model which have three-dimensional shape with non-zero thickness into zero-thickness surfaces in the analytical interface model;

automatically adjusting an extent of at least some of the zero-thickness surfaces to differ from an extent of their corresponding model elements of the architectural model by determining two or more walls are connected in the architectural model, determining a gap will occur between zero-thickness surfaces corresponding to the two or more walls in the analytical interface model, and in response to the determining two or more walls are connected and the determining a gap will occur, automatically adding a virtual surface joining the zero-thickness surfaces corresponding to the two or more walls to prevent the gap;

displaying a visual representation of the analytical interface model to a user within a user interface of the modeling application shown on the display of the computer system;

modifying the analytical interface model within the modeling application absent changing the architectural model; and transferring information regarding the spaces and the zero-thickness surfaces of the analytical interface model to the analysis application, the information used by the analysis application to build a separate analytical model used by the analysis application.

13. The method of claim 12, wherein the analysis application is an external application.

14. The method of claim 12 further comprising generating description from the analytical interface model in a format understandable by the analysis application; and providing the description to the analysis application.

15. The method of claim 14 wherein the description is a Green Building Extensible Markup Language (GBXML) file.

16. The method of claim 12, wherein the transferring further comprises:

permitting the analysis application to directly access the analytical interface model and to obtain the information regarding the spaces and the zero-thickness surfaces directly therefrom.

17. The method of claim 12, further comprising:

modifying the analytical interface model in response to input from a user in the user interface of the modeling application.

18. The method of claim 12, wherein the analytical interface model is a separate file that has a same file format as a file that stores the architectural model.

19. The method of claim 12, wherein the analytical interface model has a file format that is one of a design (DGN) file format, a drawing (DWG) file format, a drawing exchange format (DXF) file format or an interactive graphics design software (IGDS) file format.

20. The method of claim 12, wherein the analytical interface model is stored in a same file as the architectural model.

\* \* \* \* \*

UNITED STATES PATENT AND TRADEMARK OFFICE
CERTIFICATE OF CORRECTION

PATENT NO. : 8,914,256 B1
APPLICATION NO. : 12/357220
DATED : December 16, 2014
INVENTOR(S) : Matthias Schneider et al.

Page 1 of 1

It is certified that error appears in the above-identified patent and that said Letters Patent is hereby corrected as shown below:

In the specification:

Col. 5, line 54 should read:
single computer system 100, but may also be used with a variety Col. 10, line 11 should read:
are "unconditioned", they may be selected to be ignored in In the claims:

Claim 14, Col. 14, line 6 should read:
generating a description from the analytical interface model Signed and Sealed this
Twenty-eighth Day of April, 2015

Michelle K. Lee
*Director of the United States Patent and Trademark Office*